United States Patent
Dunning

(10) Patent No.: US 11,804,854 B1
(45) Date of Patent: Oct. 31, 2023

(54) CHANGING ERROR-CORRECTION CONFIGURATIONS

(71) Applicant: HEWLETT PACKARD ENTERPRISE DEVELOPMENT LP, Houston, TX (US)

(72) Inventor: Ted Emerson Dunning, Santa Clara, CA (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 0 days.

(21) Appl. No.: 17/814,867

(22) Filed: Jul. 26, 2022

(51) Int. Cl.
H03M 13/15 (2006.01)
H03M 13/00 (2006.01)

(52) U.S. Cl.
CPC ..... H03M 13/154 (2013.01); H03M 13/1515 (2013.01); H03M 13/616 (2013.01)

(58) Field of Classification Search
CPC ........... H03M 13/154; H03M 13/1515; H03M 13/616
See application file for complete search history.

(56) References Cited

U.S. PATENT DOCUMENTS

| | | | |
|---|---|---|---|
| 9,323,775 B2 | 4/2016 | Srivas et al. | |
| 10,387,253 B2 | 8/2019 | Rozas | |
| 11,074,129 B2 | 7/2021 | Horn | |
| 11,216,340 B2 | 1/2022 | Ma et al. | |
| 2019/0370119 A1* | 12/2019 | Danilov | G06F 11/1088 |
| 2020/0004592 A1* | 1/2020 | Eda | G06F 3/065 |
| 2020/0042178 A1* | 2/2020 | Danilov | G06F 3/0632 |
| 2020/0349002 A1* | 11/2020 | Danilov | G06F 3/064 |
| 2021/0132851 A1* | 5/2021 | Danilov | G06F 3/065 |
| 2021/0133049 A1* | 5/2021 | Danilov | G06F 11/1088 |

OTHER PUBLICATIONS

Ghemawat, S., et al., "The Google File System", SOSP, vol. 3, Oct. 19, 2003, pp. 15.
Manasse, M.S., et al., "A Reed-Solomon Code for Disk Storage, and Efficient Recovery Computations for Erasure-Coded Disk Storage", 2009, pp. 11.
Nicolaou, N., et al.; "ARES: Adaptive, Reconfigurable, Erasure coded, atomic Storage" May 9, 2018; 34 pages.
Plank, J., et al., "Tutorial on Reed-Solomon Coding for Fault-Tolerance in RAID-like Systems", University of Tennessee, Department of Computer Science, Nov. 13, 1996, pp. 996-1012.

(Continued)

Primary Examiner — Thien Nguyen
(74) Attorney, Agent, or Firm — Trop, Pruner & Hu, P.C.

(57) ABSTRACT

In some examples, a system groups a plurality of blocks of encoded data into first segments, each first segment comprising multiple blocks of the plurality of blocks, and the encoded data being based on application of erasure correction coding on input data. The system stores the first segments in respective failure domains of a first quantity of failure domains in a first erasure correction configuration, where the first erasure correction configuration enables error recovery in response to lost encoded data in a specified number of failure domains. The system changes from the first erasure correction configuration to a second erasure correction configuration by reorganizing the first segments into second segments, each second segment comprising a different quantity of blocks of encoded data than a first segment.

20 Claims, 4 Drawing Sheets

(56) References Cited

OTHER PUBLICATIONS

Zhu, R., et al., "Online Code Rate Adaptation in Cloud Storage Systems with Multiple Erasure Codes", Department of Electrical and Computer Engineering, Jun. 5, 2020; pp. 6.

Plank et al., "Note: Correction to the 1997 Tutorial on Reed-Salomon Coding," Apr. 24, 2003, Technical Report UT-CS-03-504, pp. 1-6, <http://web.eecs.utk.edu/~jplank/plank/papers/CS-03-504.pdf>.

* cited by examiner

CHANGING ERROR-CORRECTION CONFIGURATIONS

BACKGROUND

A storage system can be used to store data. To avoid loss of data, data can be spread across multiple storage devices of the storage system, and redundant data can be added such that the original data can be recovered if storage devices fail (either partially or in their entirety). The redundant data can be in the form of a copy of the original data, or can be in the form of encoded data produced based on application of error correction coding on the original data.

BRIEF DESCRIPTION OF THE DRAWINGS

Some implementations of the present disclosure are described with respect to the following figures.

Figure 1:
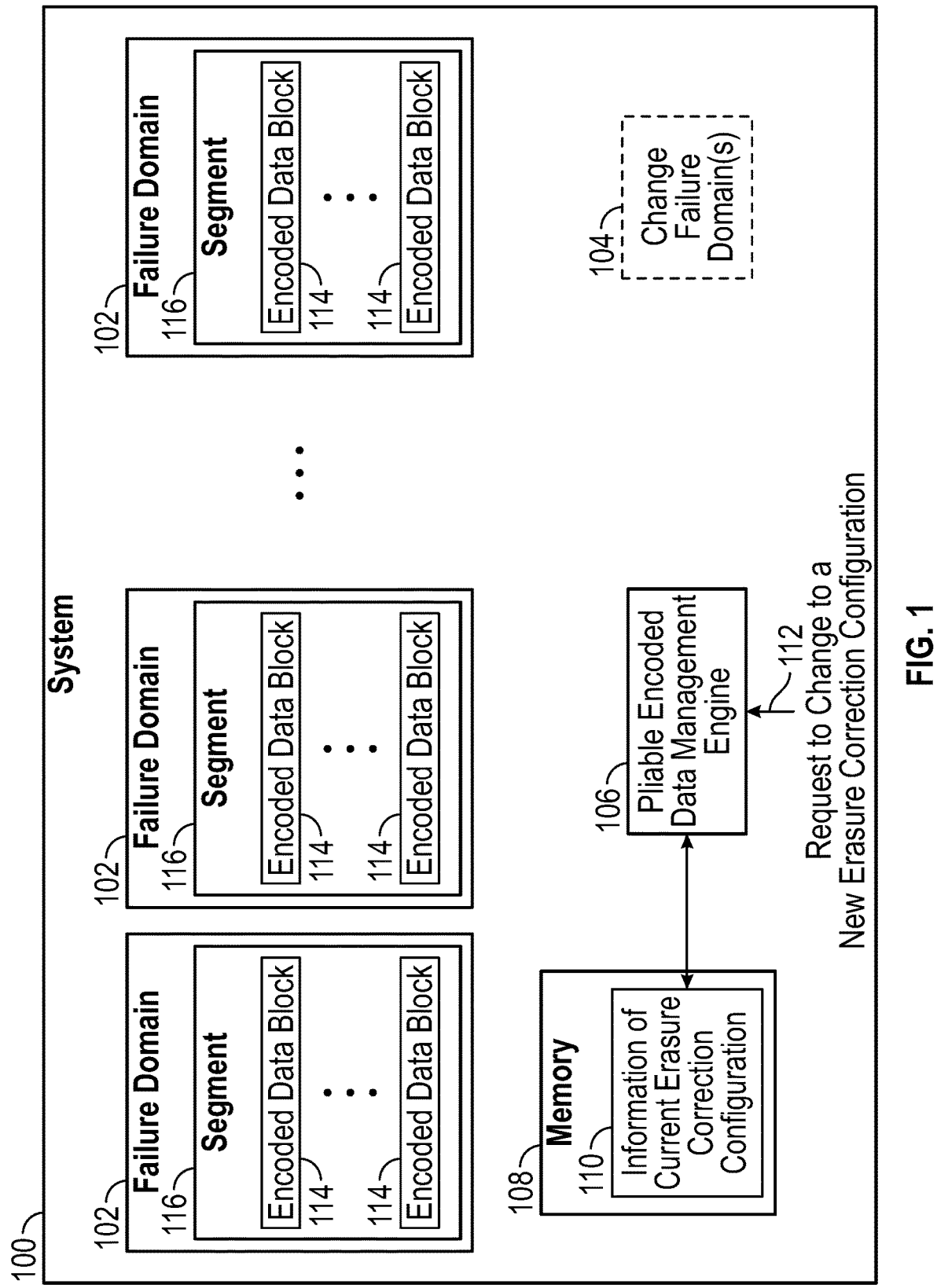
FIG. 1 is a block diagram of an arrangement that includes multiple failure domains and a pliable encoded data management engine according to some examples of the present disclosure.

Throughout the drawings, identical reference numbers designate similar, but not necessarily identical, elements. The figures are not necessarily to scale, and the size of some parts may be exaggerated to more clearly illustrate the example shown. Moreover, the drawings provide examples and/or implementations consistent with the description; however, the description is not limited to the examples and/or implementations provided in the drawings.

DETAILED DESCRIPTION

In the present disclosure, use of the term "a," "an," or "the" is intended to include the plural forms as well, unless the context clearly indicates otherwise. Also, the term "includes," "including," "comprises," "comprising," "have," or "having" when used in this disclosure specifies the presence of the stated elements, but do not preclude the presence or addition of other elements.

As used here, "original data" can refer to a version of data that is intended to be written to a storage system by a write operation initiated by a requester, which can be a user, a program, or a machine.

A storage system can include a number of physical storage devices. A "storage system" may also be referred to as a "storage pool," a "storage array," or any other term that connotes the presence of multiple physical storage devices in a storage arrangement. Examples of a storage device can include any or some combination of the following: a disk-based storage device, a solid-state drive, and so forth.

Applying erasure correction coding to original data produces internally redundant encoded data that can be used to recover the original data in case of data loss, such as due to failure of a storage device (or a portion of a storage device), fault of a program, a malware attack, or other reasons.

An example of an erasure correction code that can be used to protect data is Reed-Solomon erasure code. To be able to recover n (n>1) blocks of original data if any m>0 blocks are lost, application of Reed-Solomon erasure coding can produce encoded data that has n+m blocks, where m>0.

The n+m blocks are stored on n+m respective storage devices of the storage system. Each block of the encoded data is stored on a different storage device of the storage system. A "block" as used here can refer to any portion of data (where the portion of data has a specified size) that is divided from a larger collection of data. If the larger collection of data does not divide evenly into n blocks, the last block can be padded with zeros.

Recovery of the original data from the encoded data is possible if at least n blocks of the encoded data survive. If n>>m (n is much larger than m), the relative storage space overhead to add m blocks of redundant data is small, and data recovery can be efficient.

In some examples, d storage devices in a storage system can be used to store encoded data, where d>n+2m. For example, the data blocks of the encoded data may be spread across the d storage devices in the storage system for storage. Having more than n+m storage devices in the storage system allows a failure recovery system to guarantee that the failure recovery system can still provide a desired level of data redundancy even if several storage devices fail and cannot be replaced for an extended period of time. Data blocks of additional encoded data may be spread differently across the d storage devices so that roughly equal total amounts of data can be stored on each storage device.

In other examples, erasure correction codes different from the Reed-Solomon erasure code can define use of m blocks of redundant data to protect n blocks of original data. Other codes such as Golay codes or Bose-Chaudhuri-Hocquenghem (BCH) codes can be used. At the simplest extreme, a block of redundant data is computed based on performing an exclusive-OR operation on the n blocks of original data (or some modified version of the n blocks of original data). An n+1 code formed using exclusive-OR in this way can be used to build RAID-4 or RAID-5 storage systems.

In general, an n+m erasure correction code supports recovery of n blocks of original data in the presence of loss of up to m blocks.

Traditionally, once a storage system is configured to support a specific erasure correction code, e.g., a Reed-Solomon erasure code that includes n+m blocks spread over n+m block storage devices, the encoding of that data is fixed and is not changed unless the data is completely copied wholesale into a new form with new redundant data. In such examples, changing encoding of data (such as to spread encoded data based on the original data over a changed quantity of storage devices, e.g., due to addition of storage devices to expand the storage capacity of a storage system) would involve calculating de novo the encoded data based on the entire collection of the original data, which is computationally expensive.

In accordance with some implementations of the present disclosure, mechanisms or techniques are provided to support pliable encoding of data for data protection in which the data encoding can be efficiently changed on the fly as a storage system changes, such as due to adding storage devices or removing storage devices (e.g., so that encoded data may be spread over a changed quantity of storage devices without completely recalculating the encoded data, and in some cases, doing no more than rearranging data and deleting some data).

More generally, pliable encoded data produced by application of erasure correction coding (e.g., Reed-Solomon erasure coding) allows for a quantity of failure domains to be changed by reorganizing blocks of encoded data, where the change in quantity of failure domains can be accomplished without having to re-compute any encoded data, or by re-computing only a small amount of encoded data while mostly reusing existing blocks of encoded data. The pliable encoded data can be stretched to more failure domains or compacted to fewer failure domains.

FIG. 1 is a block diagram of an example arrangement that includes a collection of failure domains 102. A "failure domain" can refer to an entity associated with storage of data, where data loss can potentially occur at the entity (e.g., due to failure of the entity), and where the failure domain is part of a collection of failure domains that enable data recovery from the data loss in the failure domain. In some examples, the collection of failure domains 102 can include a collection of storage devices in a storage system. In other examples, the collection of failure domains 102 can include a collection of server computers or other machines, a collection of programs such as virtual machines or application programs, and so forth.

In an example where the collection of failure domains 102 includes a collection of server computers, the server computers are used to manage access of data in storage devices. Each server computer can be connected to a respective collection of storage devices (a single storage device or multiple storage devices), and the server computer manages access of data in the connected collection of storage devices. In an example shared-nothing arrangement, the collection of storage devices connected to one server computer is not shared with any other server computer.

Failure at a given server computer in the collection of server computers can cause data loss. An erasure correction code, such as the Reed-Solomon erasure code, can support data recovery from loss of data in up to m failure domains in examples where n+m erasure correction coding is employed in the collection of n+m failure domains.

The collection of failure domains 102 may be part of an overall system 100 (or more simply, "system") that supports storage of data in storage devices. The system 100 may include server computers coupled to storage devices. For example, the server computers may receive read and write requests from requesters to access data in the storage devices. Alternatively, the system 100 may be made up of a storage system including storage devices that are accessible by requesters without passing through intermediaries such as server computers.

In an example, the system 100 may initially be built from a first quantity of failure domains 102 (e.g., a first number of server computers, a first number of storage devices, etc.). Over time, the quantity of failure domains in the system 100 can change, either due to expansion in which one or more new failure domains is added to the system 100 (such as to add storage capacity), or due to contraction in which one or more existing failure domains are removed (such as due to data loss, for maintenance, to reduce storage capacity, etc.). In FIG. 1, failure domain(s) that are added or removed are represented as "change failure domain(s) 104." The change failure domain(s) 104 can thus each represent a new failure domain that has been added, or a removed existing failure domain.

Note that there may be only one or more than one changed failure domain 104 (e.g., due to addition of multiple new failure domains, or removal of multiple existing failure domains).

In an example, the system 100 may start with a relatively small quantity of failure domains 102. To support m=2 (in which data recovery is possible in response to loss of up to two failure domains 102), the quantity of non-redundant blocks is constrained so that n≤s−m, where s represents the quantity of failure domains 102. If s is relatively small (e.g., s=4), then the erasure correction coding technique used may be relatively inefficient, since the quantity of redundant failure domains (e.g., 2) make up a significant portion of the total quantity of failure domains 102 (e.g., 4). Alternatively, to improve efficiency in usage of storage resources (e.g., server computers or storage devices), the value of m can be reduced, which decreases the number of failures that can be tolerated.

As the quantity of failure domains increase, such as by adding a new failure domain, it may be become feasible to modify the erasure correction coding technique to gain efficiency (e.g., by changing from a 2+2 erasure correction coding technique (n+m, where n=2 and m=2) to a 3+2 erasure correction coding technique (n+m where n=3 and m=2) by increasing n or by increasing the number of failures that can be tolerated (that is, by increasing m).

Conversely, the quantity of failure domains may be reduced, such as due to hardware failure or other issues. For example, a hardware failure or other issue occurring in a remote location where regular maintenance is difficult may mean that the system 100 would have to continue to operate with at least one failure domain lost for some extended period of time. If data is initially stored in n+m failure domains, the loss of one or more failure domains may make it desirable to reconfigure the system 100 to use n'+m blocks where n'<n. This reconfiguration can allow the system 100 to maintain the same margin of m failures without data loss at the cost of less efficient use of storage space.

In accordance with some implementations of the present disclosure, the system 100 includes a pliable encoded data management engine 106 that supports a reconfiguration of the erasure correction code used in the system 100 when the quantity of failure domains changes (increases or decreases). The pliable encoded data management engine 106 is able to change the erasure correction code without having to recompute erasure correction codes from scratch based on the entire collection of data stored in the system 100. The pliable encoded data management engine 106 supports erasure correction code reconfiguration as the system 100 scales up or scales down.

As used here, an "engine" can refer to a hardware processing circuit, which can include any or some combination of a microprocessor, a core of a multi-core microprocessor, a microcontroller, a programmable integrated circuit, a programmable gate array, or another hardware processing circuit. Alternatively, an "engine" can refer to a combination of a hardware processing circuit and machine-readable instructions (software and/or firmware) executable on the hardware processing circuit.

As further depicted in FIG. 1, the system 100 includes a memory 108 that stores information 110 of a current erasure correction configuration (that uses an existing erasure correction code) used in the system 100. The memory 108 can be implemented using a collection of memory devices (a single memory device or multiple memory devices). A memory device can include any or some combination of the following: a dynamic random-access memory (DRAM) device, a static random-access memory (SRAM) device, a flash memory device, and so forth. In other examples, the information 110 of the current erasure correction configuration can be stored in another type of storage, such as a disk-based storage, a solid-state drive, and so forth.

The pliable encoded data management engine 106 receives a request 112 to change to a new erasure correction configuration (which uses a new erasure correction code different from the existing erasure correction code). The request 112 may be provided by a user, a program, or a machine. For example, a user at a remote computing device can issue, over a network, the request to the pliable encoded data management engine 106 due to a change in the configuration of the system 100, such as by adding a new failure domain or removing an existing failure domain.

In some examples of the present disclosure, the pliable encoded data management engine 106 can group multiple encoded data blocks 114 into segments 116. An encoded data block 114 is a block of encoded data produced by applying erasure correction coding to original data. The application of the erasure correction coding to the original data produces encoded data, which can be divided into encoded data blocks 114 to be stored across multiple failure domains 102.

A "segment" can refer to a collection of encoded data blocks 114 (a single encoded data block or multiple encoded data blocks). In FIG. 1, each segment 116 includes multiple encoded data blocks 114. According to some implementations of the present disclosure, a segment-wise erasure correction code (e.g., a segment-wise Reed-Solomon erasure code) includes n+m segments, where each segment includes $q \geq 1$ encoded data blocks and is contained in a respective failure domain. In this arrangement, there are nq+mq data blocks in total. In contrast, a traditional erasure correction code (e.g., a traditional Reed-Solomon erasure code) includes n+m encoded data blocks. The segment-wise erasure correction code can protect against loss of up to m segments.

In an example, it is assumed that a Reed-Solomon erasure correction code is used to encode 12 data blocks so that the encoded data includes 12+12 encoded data blocks $b_1$ to $b_{24}$ (in this example, nq=12 and mq=12):

$[b_1, b_2, b_3, \ldots, b_{23}, b_{24}]$

In an example, the above encoded data blocks are grouped into four segments each containing q=6 data blocks, as follows:

Segment 1=$[b_1, b_2, b_3, b_4, b_5, b_6]$,
Segment 2=$[b_7, b_8, b_9, b_{10}, b_{11}, b_{12}]$,
Segment 3=$[b_{13}, b_{14}, b_{15}, b_{16}, b_{17}, b_{18}]$, and
Segment 4=$[b_{19}, b_{20}, b_{21}, b_{22}, b_{23}, b_{24}]$ These four segments may be used to implement a 2+2 segment-wise erasure correction code (n+m, where n=2 and m=2). In this erasure correction code each segment includes multiple (q=6 in the example) encoded data blocks, and the four segments are contained in respective four failure domains. The 2+2 segment-wise erasure correction code can protect against loss of up to any 2 of the 4 segments because any 2 segments contain 12 encoded data blocks which allows the 12 original data blocks to be recovered.

When the system 100 is expanded by adding new failure domain(s), the segment-wise erasure correction code can be reorganized to change the erasure correction configuration from the current erasure correction configuration (which uses the existing erasure correction code) to the new erasure correction configuration (which uses the new erasure correction code). The current erasure correction configuration can use the 2+2 segment-wise erasure correction code above. If one additional failure domain is added, then the new erasure correction configuration uses a 3+2 segment-wise erasure correction code (n+m, where n=3 and m=2), in which the encoded data blocks are regrouped into five segments as follows:

Segment 1=$[b_1, b_2, b_3, b_4]$,
Segment 2=$[b_5, b_6, b_7, b_8]$,
Segment 3=$[b_9, b_{10}, b_{11}, b_{12}]$,
Segment 4=$[b_{13}, b_{14}, b_{15}, b_{16}]$, and
Segment 5=$[b_{17}, b_{18}, b_{19}, b_{20}]$.

Note that these 5 segments are formed by simply rearranging the data blocks used in the 2+2 code described above and discarding 4 encoded data blocks, $b_{21}$, $b_{22}$, $b_{23}$, $b_{24}$. After this reconfiguration, q=4. If no more than 2 of these segments are lost, then the remaining 3 segments will contain 12 data blocks and thus will allow the recovery of the original data.

The five segments are contained in five failure domains. If yet another failure domain is added to result in six failure domains, then a new erasure correction configuration uses a 4+2 segment-wise erasure correction code (n+m, where n=4 and m=2), in which the encoded data blocks are regrouped into six segments (contained in the respective six failure domains) as follows:

Segment 1=$[b_1, b_2, b_3]$,
Segment 2=$[b_4, b_5, b_6]$,
Segment 3=$[b_7, b_8, b_9]$,
Segment 4=$[b_{10}, b_{11}, b_{12}]$,
Segment 5=$[b_{13}, b_{14}, b_{15}]$, and
Segment 6=$[b_{16}, b_{17}, b_{18}]$.

Note that these 6 segments are formed by rearranging the data blocks in the 2+2 or 3+2 codes with an additional two more encoded data blocks ($b_{19}$ and $b_{20}$) being discarded, in addition to the 4 encoded data blocks ($b_{21}$, $b_{22}$, $b_{23}$, $b_{24}$) previously discarded. In this arrangement, q=3. In other words, the 4+2 segment-wise erasure correction code above does not use encoded data blocks $b_{19}$ to $b_{24}$.

If the six failure domains are increased to 14 failure domains, then a new erasure correction configuration uses a 12+2 segment-wise erasure correction code (n+m, where n=12 and m=2), in which the encoded data blocks are regrouped into 14 segments (contained in the respective 14 failure domains) as follows:

Segment 1=$[b_1]$,
Segment 2=$[b_2]$,
Segment 3=$[b_3]$,
Segment 4=$[b_4]$,
Segment 5=$[b_5]$,
Segment 6=$[b_6]$,
Segment 7=$[b_7]$,
Segment 8=$[b_8]$,
Segment 9=$[b_9]$,
Segment 10=$[b_{10}]$,
Segment 11=$[b_{11}]$,
Segment 12=$[b_{12}]$,
Segment 13=$[b_{13}]$, and
Segment 14=$[b_{14}]$.

The 12+2 segment-wise erasure correction code above does not use encoded data blocks $b_{19}$ to $b_{24}$ but can recover the original data if only 12 segments are retained.

Reorganization of the segment-wise erasure correction code in these examples is performed by simply copying existing encoded data blocks and discarding some encoded data blocks to form new segments of encoded data blocks to support a new erasure correction code.

The example described above began with 24 encoded data blocks (i.e., 12+12, where n=12 and m=12), encoded such that 12 encoded blocks of data (e.g., the first n blocks) can be recovered from any 12 of the starting 24 encoded data blocks. As can be seen above, each erasure correction configuration includes at least 12 of the original 24 encoded blocks, enabling recovery of 12 original data blocks in each erasure correction configuration.

A similar process can be used to convert an n+m segment erasure code with p data blocks per segment to any n'+m' configuration with p' data blocks per segment as long as n'p'≥np. Further, if (n'+m')p'≤(n+m)p then the conversion involves only reconfiguration and deletion of blocks. If (n'+m')p'>(n+m)p, then re-computation of some blocks will be performed in addition to rearrangement. For instance, when converting from the 4+2 configuration with p=3 to the 3+2 configuration with p'=4, blocks $b_{19}$ and $b_{20}$ are re-computed.

In the current erasure correction configuration, the segments 116 are stored in a first quantity of failure domains 102. The current erasure correction configuration enables error recovery in response to lost segments in a specified number (m) of the failure domains 102.

Figure 2:
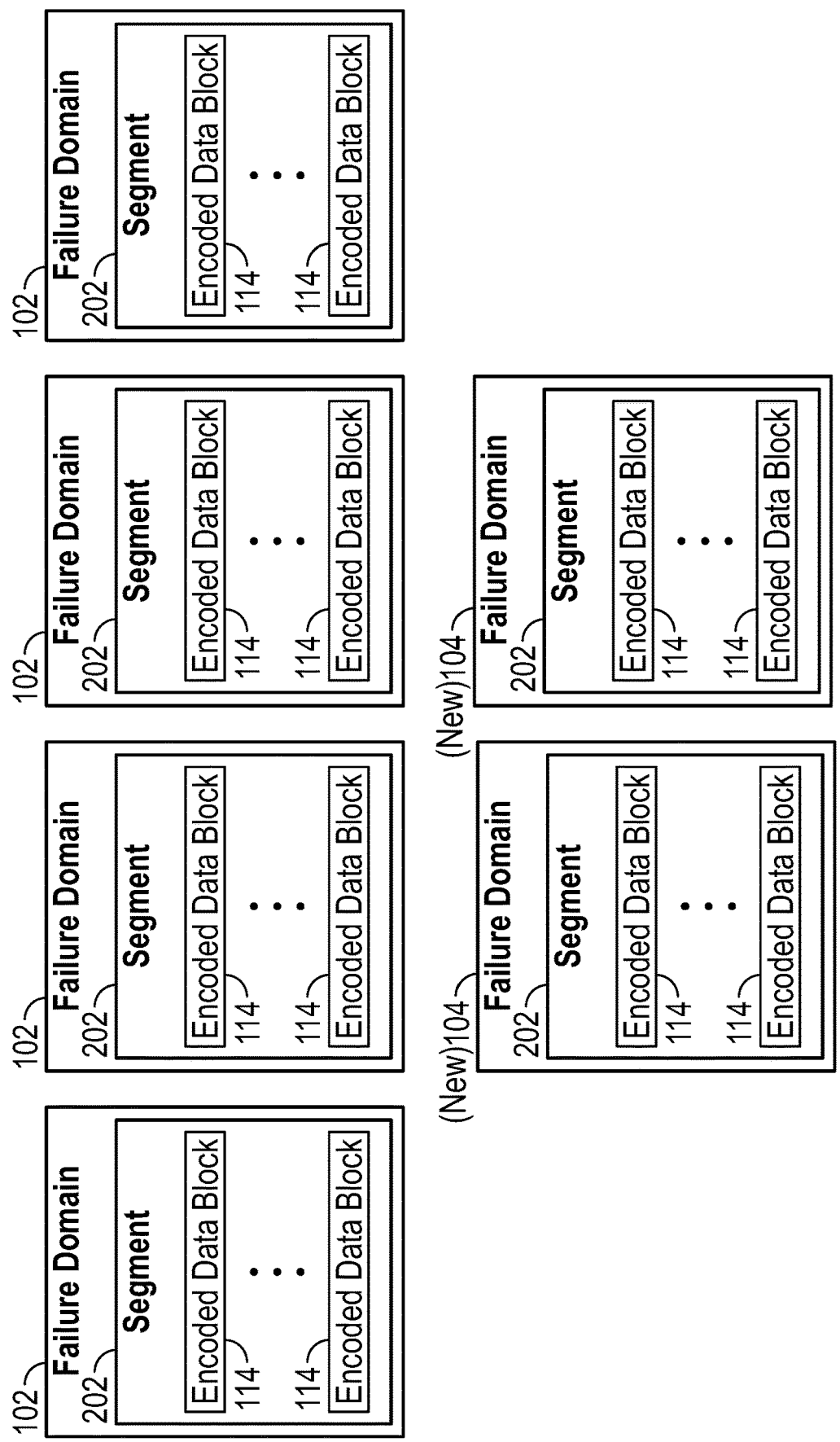
FIG. 2 is a block diagram illustrate of an arrangement that include a larger quantity of failure domains, according to some examples.

In response to the request 112, the pliable encoded data management engine 106 changes an erasure correction configuration from the current erasure correction configuration to the new erasure correction configuration by reorganizing the segments 116 into further segments 202 as shown in FIG. 2.

In the example of FIG. 2, it is assumed that the first quantity of failure domains 102 (prior to the change) is 4. It is assumed that one or more new failure domains 104 are added (two new failure domains 104 are shown in the example of FIG. 2). With 4 failure domains 102 that includes 4 respective segments 116, a 2+2 erasure correction code is supported. However, by adding two new failure domains 104, the system 100 is changed to include a second quantity of failure domains (6 in the example of FIG. 2) that include 6 respective segments 202, so that the pliable encoded data management engine 106 can change from the 2+2 erasure correction code (of the existing erasure correction configuration) to the 4+2 erasure correction code (of the new erasure correction configuration).

Note that each segment 202 includes a different quantity of encoded data blocks 114 than any segment 116.

After the reconfiguration, the pliable encoded data management engine 106 stores the segments 202 in respective failure domains 102 and 104 (which make up the second quantity of failure domains) to provide the new erasure correction configuration.

Although examples discussed herein refer to application of erasure correction coding, techniques or mechanisms according to some implementations of rearranging blocks of an encoded data into encoded segments can be applied as well to general error coding as well as to erasure coding. In such a more general case, it is not usually known which segment may have been corrupted and so only $\lfloor m/2 \rfloor$ errors can be corrected where $\lfloor m/2 \rfloor$ is a function that returns the largest integer less than or equal to m/2. Given encoded data produced by the error correction coding that includes n+m blocks, identification and correction of corrupted data can be performed if n+$\lceil m/2 \rceil$ blocks are retained where $\lceil m/2 \rceil$ is a function that returns the smallest integer greater than or equal to m/2.

Reed-Solomon Erasure Coding

The following describes Reed-Solomon erasure coding.

The original data can be written as a matrix x with n rows each containing k (k≥1) values, with each value having w bits. For example, w=8 so that each value in the original x or the encoded data r is an unsigned 8-bit integer (commonly known as a byte) and the original data x includes of n blocks, each containing k bytes.

In other examples, w can have a different non-zero value.

In this representation, each row of x can be taken as a single block of data. The encoded data r is computed by multiplying an encoding matrix A with the original data x:

$Ax=r$.

The encoding matrix A has n+m rows so r is (n+m)×k bytes in size. Note that the encoded data r has n+m rows (or equivalently in some examples, n+m blocks).

For Reed-Solomon erasure coding, the arithmetic can be performed in the modular Galois field $GF(2^w)$ where addition is exclusive-OR and multiplication is done modulo a primitive polynomial.

In some examples, A represents a systematic code where the first n values in r are identical to the values in x. A systematic code is a code that when applied to input data produces an output code that has a portion that is made up of the input data and another portion that contains the redundant information.

If A represents a systematic code, then A can be expressed as the following structure:

$$A = \begin{bmatrix} I_n \\ F_{m,n} \end{bmatrix},$$

where $I_n$ is an identity matrix that has n rows, and $F_{m,n}$ is a specified encoding matrix. The identity matrix $I_n$ when multiplied to the original data x produces the first n rows of the encoded data r that is equal to the n rows of the original data x.

The $F_{m,n}$ (which has m rows and n columns) when multiplied to the original data x produces m rows of parity data p.

The multiple of $$\begin{bmatrix} I_n \\ F_{m,n} \end{bmatrix}$$

(the systematic code A) with the original data x produces the following encoded data r:

$$r = \begin{bmatrix} x \\ p \end{bmatrix} = \begin{bmatrix} x \\ F_{m,n}x \end{bmatrix}.$$

Effectively, the encoded data r can be written as the concatenation of the original data x and the parity data p produced by $F_{m,n}x$.

If the parity data p is small with respect to x (the number of rows, m, of the parity data p is much smaller than the number of rows, n, of the original data x), computing $p=F_{m,n}x$ can be performed faster than it would be with a non-systematic code A.

However, in other examples of the present disclosure, A can be a non-systematic code.

In some examples, $F_{m,n}$ can be a partial Vandermonde matrix, as follows:

$$F_{m,n} = \begin{bmatrix} 1 & 1 & 1 & \dots & 1 \\ 1 & 2 & 3 & \dots & n \\ \vdots & & & \ddots & \vdots \\ 1^m & 2^m & 3^m & \dots & n^m \end{bmatrix}.$$

Vandermonde matrices in the modular Galois field $GF(2^w)$ have the property that if $n+m<2^w$ then $\text{rank}(A)=n$. In fact, the rank of any matrix A' created by selecting any n rows from A also has rank n. The fact that any n×n sub-matrix of A is full rank is useful in erasure correction because if any n rows out of the n+m rows of the encoded data r are selected, the following is obtained:

$$A'x=r'.$$

where the rows of A' (that is a sub-matrix of A) correspond to the rows of r' (which is a subset of r).

A matrix is full rank if all rows and columns of the matrix are linearly independent.

Because A' is full rank, A' is invertible, and the system can solve for x given the value of r' and the knowledge of which n rows survived (i.e., which n encoded data blocks of the failure domains have not been lost). The practical implication is that if any n of the n+m rows of the encoded data r are retained, the entire value of the original data x can be recovered. Further, since m can be small (e.g., much smaller than n), A' can be nearly the same as the identity matrix so a complete lower-upper (LU) decomposition used to derive x based on A' and r' can be efficiently performed. Specifically, because A represents a systematic code, the LU decomposition of A' can be done by decomposing whatever rows of $F_{n,m}$ survive in A'. The rest of A' is unchanged.

Pliable Reed-Solomon Erasure Coding

The following describes some examples of pliable Reed-Solomon erasure coding according to some implementations of the present disclosure.

The pliable Reed-Solomon erasure coding provided by the pliable encoded data management engine 106 according to some examples of the present disclosure allow for a change of the erasure code with much less computation than is used to recompute the encoded data from the entire collection of the original data.

In some examples, for an n+m Reed-Solomon erasure code, m can be set to 1, 2, or 3, and n≤12. Larger values of n (greater than 12) may result in negligible improvements in coding efficiency. The above constraints allow for a construction of a family of related erasure codes based on Reed-Solomon encoded data that can start with n=2 initially, with n increasing in value to 3, 4, 6, or 12, for example, by simply rearranging encoded data blocks (and discarding some encoded data blocks).

Increasing the value of n can be performed in response to increasing the quantity of failure domains, such as by adding server computers or storage devices to the system 100.

Although specific examples of n and m are given above, it is noted that in other examples, different values of n and/or m can be used by the pliable encoded data management engine 106 according to some implementations of the present disclosure.

In a specific example, the pliable encoded data management engine 106 can define a basic coding structure of a 12+12 Reed-Solomon erasure code expressed row by row as follows:

$$\begin{bmatrix} I_1 \\ \vdots \\ I_{12} \\ F_{12,12,1} \\ \vdots \\ F_{12,12,12} \end{bmatrix} \begin{bmatrix} x_1 \\ \vdots \\ x_{12} \end{bmatrix} = \begin{bmatrix} x_1 \\ \vdots \\ x_{12} \\ r_1 \\ \vdots \\ r_{12} \end{bmatrix}$$

where $x_1$ to $x_{12}$ are the 12 rows (or blocks) of the original data x, $I_1$ to $I_{12}$ are the 12 rows of the identity matrix $I_{12}$ (an identity matrix with 12 rows), $F_{12,12,1}$ to $F_{12,12,12}$ are 12 sub-matrices of the $F_{12,12}$ matrix (the $F_{12,12}$ matrix has 12 rows and 12 columns), and $r_1$ to $r_{12}$ are the 12 rows of parity data p produced by $F_{m,n}x$. Here $I_j$ represents the j-th row of the identity matrix $I_n$, and $F_{12,12,j}$ represents the j-th row of $F_{12,12}$, namely $[1^j, 2^j, \ldots, n^j]$.

The above representation of the 12+12 Reed-Solomon erasure code can be rearranged in segment-wise form as:

$$\begin{bmatrix} \begin{bmatrix} I_1 \\ \vdots \\ I_6 \end{bmatrix} \\ \begin{bmatrix} I_7 \\ \vdots \\ I_{12} \end{bmatrix} \\ \begin{bmatrix} F_{12,12,1} \\ \vdots \\ F_{12,12,6} \end{bmatrix} \\ \begin{bmatrix} F_{12,12,7} \\ \vdots \\ F_{12,12,12} \end{bmatrix} \end{bmatrix} \begin{bmatrix} \begin{bmatrix} x_1 \\ \vdots \\ x_6 \end{bmatrix} \\ \begin{bmatrix} x_7 \\ \vdots \\ x_{12} \end{bmatrix} \end{bmatrix} = \begin{bmatrix} \begin{bmatrix} x_1 \\ \vdots \\ x_6 \end{bmatrix} \\ \begin{bmatrix} x_7 \\ \vdots \\ x_{12} \end{bmatrix} \\ \begin{bmatrix} r_1 \\ \vdots \\ r_6 \end{bmatrix} \\ \begin{bmatrix} r_7 \\ \vdots \\ r_{12} \end{bmatrix} \end{bmatrix},$$

where $$\begin{bmatrix} x_1 \\ \vdots \\ x_6 \end{bmatrix}, \begin{bmatrix} x_7 \\ \vdots \\ x_{12} \end{bmatrix}, \begin{bmatrix} r_1 \\ \vdots \\ r_6 \end{bmatrix}, \text{ and } \begin{bmatrix} r_7 \\ \vdots \\ r_{12} \end{bmatrix}$$

are four segments each with 6 encoded data blocks. The 6 "encoded data blocks" of each of segments $$\begin{bmatrix} x_1 \\ \vdots \\ x_6 \end{bmatrix} \text{ and } \begin{bmatrix} x_7 \\ \vdots \\ x_{12} \end{bmatrix}$$

are actually original data blocks, while the 6 "encoded data blocks" of each of segments $$\begin{bmatrix} r_1 \\ \vdots \\ r_6 \end{bmatrix} \text{ and } \begin{bmatrix} r_7 \\ \vdots \\ r_{12} \end{bmatrix}$$

are each parity blocks (blocks of p).

Each of the four segments $$\begin{bmatrix} x_1 \\ \vdots \\ x_6 \end{bmatrix}, \begin{bmatrix} x_7 \\ \vdots \\ x_{12} \end{bmatrix}, \begin{bmatrix} r_1 \\ \vdots \\ r_6 \end{bmatrix}, \text{ and } \begin{bmatrix} r_7 \\ \vdots \\ r_{12} \end{bmatrix}$$

can be an example of a segment 116 shown in FIG. 1.

The above form of the 12+12 Reed-Solomon erasure code can be written in a more abbreviated form as:

$$\begin{bmatrix} I_{1\ldots 6} \\ I_{7\ldots 12} \\ F_{1\ldots 6} \\ F_{7\ldots 12} \end{bmatrix} \begin{bmatrix} X_{1\ldots 6} \\ X_{7\ldots 12} \end{bmatrix} = \begin{bmatrix} X_{1\ldots 6} \\ X_{7\ldots 12} \\ R_{1\ldots 6} \\ R_{7\ldots 12} \end{bmatrix},$$

where $$X_{1\ldots 6} = \begin{bmatrix} x_1 \\ \vdots \\ x_6 \end{bmatrix}, X_{7\ldots 12} = \begin{bmatrix} x_7 \\ \vdots \\ x_{12} \end{bmatrix},$$

$$R_{1\ldots 6} = \begin{bmatrix} r_1 \\ \vdots \\ r_6 \end{bmatrix}, \text{ and } R_{7\ldots 12} = \begin{bmatrix} r_7 \\ \vdots \\ r_{12} \end{bmatrix}.$$

The above form, $$\begin{bmatrix} X_{1\ldots 6} \\ X_{7\ldots 12} \\ R_{1\ldots 6} \\ R_{7\ldots 12} \end{bmatrix},$$

with four segments (in respective 4 failure domains) can be viewed as a 2+2 erasure code. The four segments are segment $X_{1\ldots 6}$, segment $X_{7\ldots 12}$, segment $R_{1\ldots 6}$, and segment $R_{7\ldots 12}$.

If one new failure domain is added to provide 5 failure domains, then the above erasure code, $$\begin{bmatrix} X_{1\ldots 6} \\ X_{7\ldots 12} \\ R_{1\ldots 6} \\ R_{7\ldots 12} \end{bmatrix},$$

can be rearranged as follows into 5 respective segments $X_{1\ldots 4}, X_{5\ldots 8}, X_{9\ldots 12}, R_{1\ldots 4}$, and $R_{5\ldots 8}$:

$$\begin{bmatrix} I_{1\ldots 4} \\ I_{1\ldots 8} \\ I_{9\ldots 12} \\ F_{1\ldots 4} \\ F_{5\ldots 8} \end{bmatrix} \begin{bmatrix} X_{1\ldots 4} \\ X_{5\ldots 8} \\ X_{9\ldots 12} \end{bmatrix} = \begin{bmatrix} X_{1\ldots 4} \\ X_{5\ldots 8} \\ X_{9\ldots 12} \\ R_{1\ldots 4} \\ R_{5\ldots 8} \end{bmatrix}.$$

The 5 segments can be an example of the segments 202 shown in FIG. 2.

Note that in the 5 segments, rows $r_9$ to $r_{12}$ of the parity data p have been discarded, and just 8 rows of the encoded data ($x_1$ to $x_{12}$ and $r_1$ to $r_8$) are used. Note also only 8 rows of F are used.

Each of the 5 segments $X_{1\ldots 4}, X_{5\ldots 8}, X_{9\ldots 12}, R_{1\ldots 4}$, and $R_{5\ldots 8}$ includes 4 encoded data blocks. These 5 segments above provide is a 3+2 erasure code.

Note that the 2+2 erasure code can be converted into the 3+2 erasure code by simply rearranging rows of the original data, $x_1$ to $x_{12}$, and discarding 4 rows of p.

A similar process can be used to create a 4+2 erasure code from the 3+2 erasure code as set forth below:

$$\begin{bmatrix} I_{1\ldots 3} \\ I_{4\ldots 6} \\ I_{7\ldots 9} \\ I_{10\ldots 12} \\ F_{1\ldots 3} \\ F_{4\ldots 6} \end{bmatrix} \begin{bmatrix} X_{1\ldots 3} \\ X_{4\ldots 6} \\ X_{7\ldots 9} \\ X_{10\ldots 12} \end{bmatrix} = \begin{bmatrix} X_{1\ldots 3} \\ X_{4\ldots 6} \\ X_{7\ldots 9} \\ X_{10\ldots 12} \\ R_{1\ldots 3} \\ R_{4\ldots 6} \end{bmatrix},$$

in which rows $r_7$ to $r_{12}$ of the parity data p have been discarded, and just 6 rows of the encoded data ($x_1$ to $x_{12}$ and $r_1$ to $r_8$) are used. Note also only 6 rows of F are used.

The output of this 4+2 erasure (including 6 segments) can be derived from the output of the 3+2 erasure code by rearranging rows of the original data, $x_1$ to $x_{12}$, and discarding 6 rows of the parity data p. In converting from the 3+2 erasure code to the 4+2 erasure code, the 5 segments $X_{1\ldots 4}, X_{5\ldots 8}, X_{9\ldots 12}, R_{1\ldots 4}$, and $R_{5\ldots 8}$ corresponding to the 3+2 erasure code are considered the segments 116 of FIG. 1, and the 6 segments $X_{1\ldots 3}, X_{4\ldots 6}, X_{7\ldots 9}, X_{10\ldots 12}, R_{1\ldots 3}$, and $R_{4\ldots 6}$ corresponding to the 4+2 erasure code are considered the segments 202 of FIG. 2.

A similar process can be used to form a 6+2 erasure code from the 4+2 erasure code, and form a 12+2 erasure code from the 6+2 erasure code.

In accordance with some implementations of the present disclosure, the conversions from n=2 to n=3 and ultimately to n=12 involve just copying and deletion, and not computations of encoded data.

In the opposite direction, to reduce the quantity of failure domains (such as by removing one or more failure domains), a small amount of computation may have to be performed. As an example, a 4+2 erasure code can be converted to a 3+2 erasure code, in which the 6 segments $X_{1\ldots 3}, X_{4\ldots 6}, X_{7\ldots 9}, X_{10\ldots 12}, R_{1\ldots 3}$, and $R_{4\ldots 6}$ corresponding to the 4+2 erasure code are considered the segments 116 of FIG. 1, and the 5 segments $X_{1\ldots 4}, X_{5\ldots 8}, X_{9\ldots 12}$, and $R_{5\ldots 8}$ corresponding to the 3+2 erasure code are considered the segments 202 of FIG. 2.

Note that the 6 segments $X_{1\ldots 3}, X_{4\ldots 6}, X_{7\ldots 9}, X_{10\ldots 12}, R_{1\ldots 3}$, and $R_{4\ldots 6}$ corresponding to the 4+2 erasure code are missing rows $r_7$ and $r_8$ of the parity data p, since these rows were discarded when transitioning to the 4+2 erasure code. As a result, the rows $r_7$ and $r_8$ of the parity data p, which form part of the 5 segments $X_{1\ldots 4}, X_{5\ldots 8}, X_{9\ldots 12}, R_{1\ldots 4}$, and $R_{5\ldots 8}$ corresponding to the 3+2 erasure code.

Note that just two rows of the parity data p are computed in this example, rather than having to recompute all rows of the parity data p.

Further Example Implementations

Figure 3:
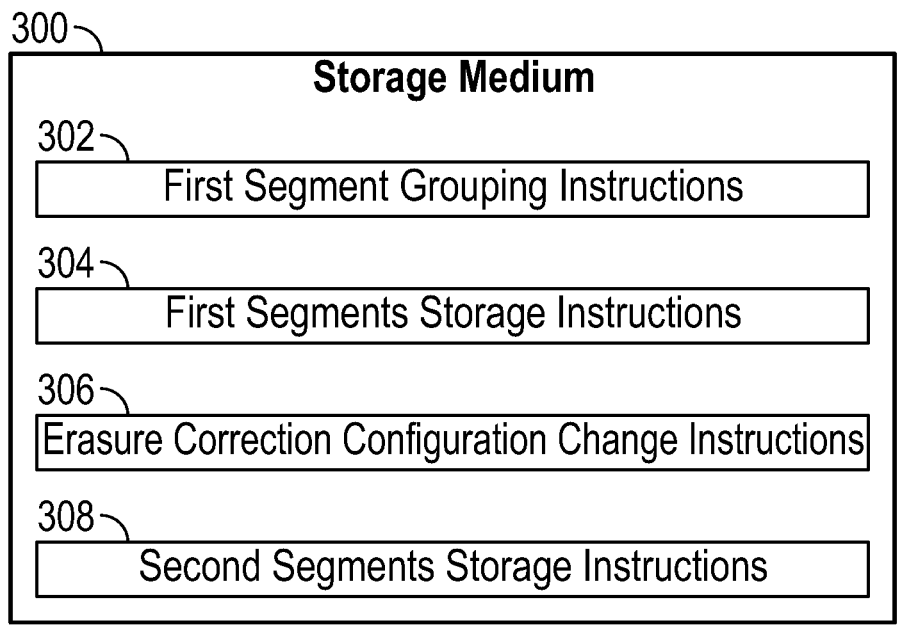
FIG. 3 is a block diagram of a storage medium storing machine-readable instructions according to some examples.

FIG. 3 is a block diagram of a non-transitory machine-readable or computer-readable storage medium 300 storing machine-readable instructions that upon execution cause a system to perform various tasks. The system can include a computer or multiple computers.

The machine-readable instructions include first segment grouping instructions 302 to group a plurality of blocks of encoded data into first segments (e.g. segments 116 in FIG. 1), where each first segment includes multiple blocks of the plurality of blocks, and the encoded data is based on application of erasure correction coding on input data.

The machine-readable instructions include first segments storage instructions 304 to store the first segments in respective failure domains of a first quantity of failure domains in a first erasure correction configuration, where the first erasure correction configuration enables error recovery in response to lost encoded data in a specified number (m) of the plurality of failure domains.

The machine-readable instructions include erasure correction configuration change instructions 306 to change an erasure correction configuration from the first erasure correction configuration to a second erasure correction configuration by reorganizing the first segments into second segments (e.g., 202 in FIG. 2). Each second segment includes a different quantity of blocks of encoded data than a first segment.

In some examples, the reorganizing of the first segments into the second segments to change to the second erasure correction configuration is performed without recomputing encoded data based on the input data.

In some examples, the reorganizing discards a number of the plurality of blocks of encoded data to produce a remainder of the plurality of blocks of encoded data, where the machine-readable instructions group the remainder of the plurality of blocks of encoded data into the second segments.

The machine-readable instructions include second segments storage instructions 308 to store the second segments in respective failure domains of a second quantity of failure domains in the second erasure correction configuration, where the second quantity is different from the first quantity.

In some examples, the first segments according to the first erasure correction configuration include $n_1+m$ first segments, where $n_1$ represents a number of segments of the input data recoverable in a presence of up to m segments of lost encoded data. The second segments according to the second erasure correction configuration include $n_2+m$ first segments, where $n_2>n_1$, and $n_2$ represents a number of segments of the input data recoverable in a presence of up to m segments of lost encoded data.

In some examples, the machine-readable instructions change the erasure correction configuration from the second erasure correction configuration to a third erasure correction configuration by reorganizing the second segments into third segments, each third segment of the third segments including a different quantity of blocks of encoded data than a second segment of the second segments.

In some examples, the third erasure correction configuration includes a third quantity of failure domains, the third quantity different from the second quantity.

In some examples, the machine-readable instructions change the erasure correction configuration from the second erasure correction configuration to a third erasure correction configuration associated with a third quantity of failure domains that is less than the second quantity of failure domains, where the changing of the erasure correction configuration from the second erasure correction configuration to the third erasure correction configuration includes copying the blocks of encoded data in the second segments to third segments, and recomputing blocks of encoded data to add to the third segments.

In some examples, the recomputing of the blocks of encoded data to add to the third segments includes recomputing less than the plurality of blocks.

In some examples, each third segment of the third segments has a larger quantity of blocks of encoded data than a second segment of the second segments.

In some examples, the first quantity of failure domains includes a first quantity of server computers or a first quantity of storage devices, and the second quantity of failure domains includes a second quantity of server computers or a second quantity of storage devices.

In some examples, the plurality of blocks of encoded data include a first number of blocks of the input data, and a second number of blocks of parity data computed based on applying an encoding matrix to the input data.

Figure 4:
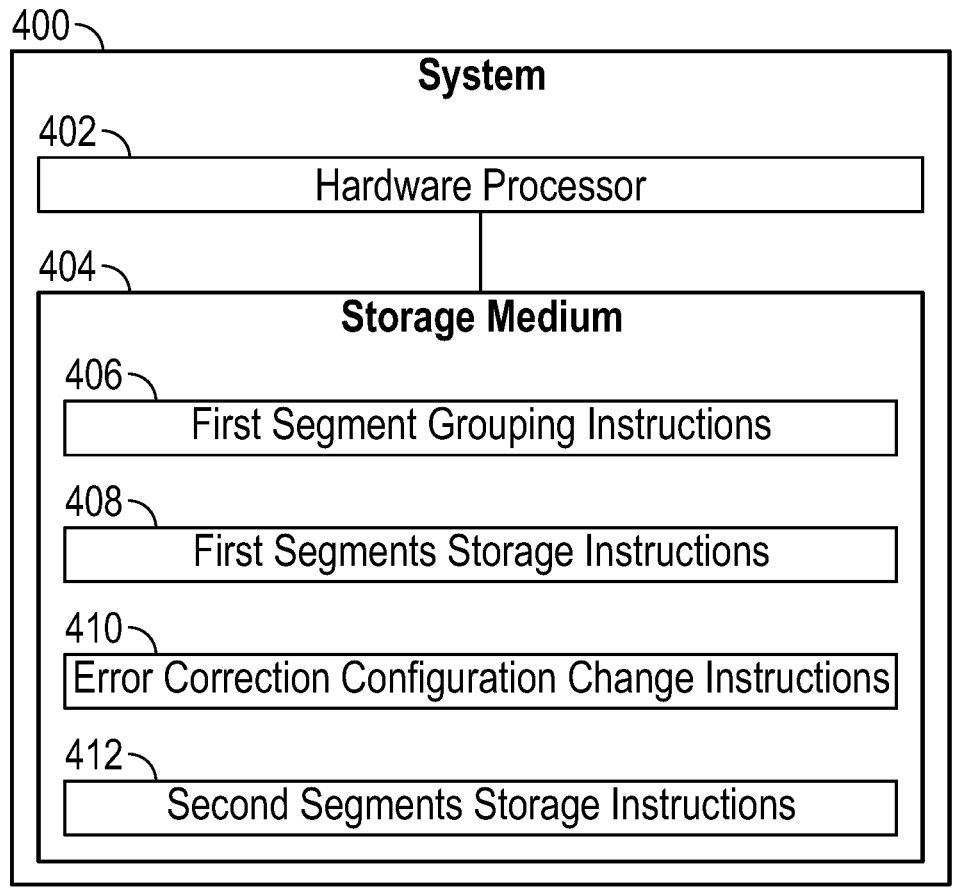
FIG. 4 is a block diagram of a system according to some examples.

FIG. 4 is a block diagram of a system 400 according to some examples.

The system 400 includes a hardware processor 402 (or multiple hardware processors). A hardware processor can include a microprocessor, a core of a multi-core microprocessor, a microcontroller, a programmable integrated circuit, a programmable gate array, or another hardware processing circuit.

The system 400 includes a storage medium 404 storing machine-readable instructions executable on the hardware processor 402 to perform various tasks. Machine-readable instructions executable on a hardware processor can refer to the instructions executable on a single hardware processor or the instructions executable on multiple hardware processors.

The machine-readable instructions in the storage medium 404 include first segment grouping instructions 406 to group a plurality of blocks of encoded data into first number of segments, each segment of the first number of segments including multiple blocks of the plurality of blocks, and the encoded data being based on application of error correction coding (e.g., erasure correction coding or other error correction coding) on input data.

The machine-readable instructions in the storage medium 404 include first segments storage instructions 408 to store the segments of the first number of segments in respective failure domains of a first quantity of failure domains in a first error correction configuration, where the first number of segments support data recovery in response to up to a specified number of lost segments of the first number of segments.

The machine-readable instructions in the storage medium 404 include error correction configuration change instructions 410 to change an error correction configuration from the first error correction configuration to a second error correction configuration by reorganizing the first number of segments into a second number of segments, each segment of the second number of segments including a different quantity of blocks of encoded data than a segment of the first number of segments.

The machine-readable instructions in the storage medium 404 include second segments storage instructions 412 to store the segments of the second number of segments in respective failure domains of a second quantity of failure domains in the second error correction configuration, where the second quantity is different from the first quantity, and a quantity of the segments in the second number of segments is different from a quantity of the segments in the first number of segments, and where the second number of segments support data recovery in response to up to the specified number of lost segments of the second number of segments.

Figure 5:
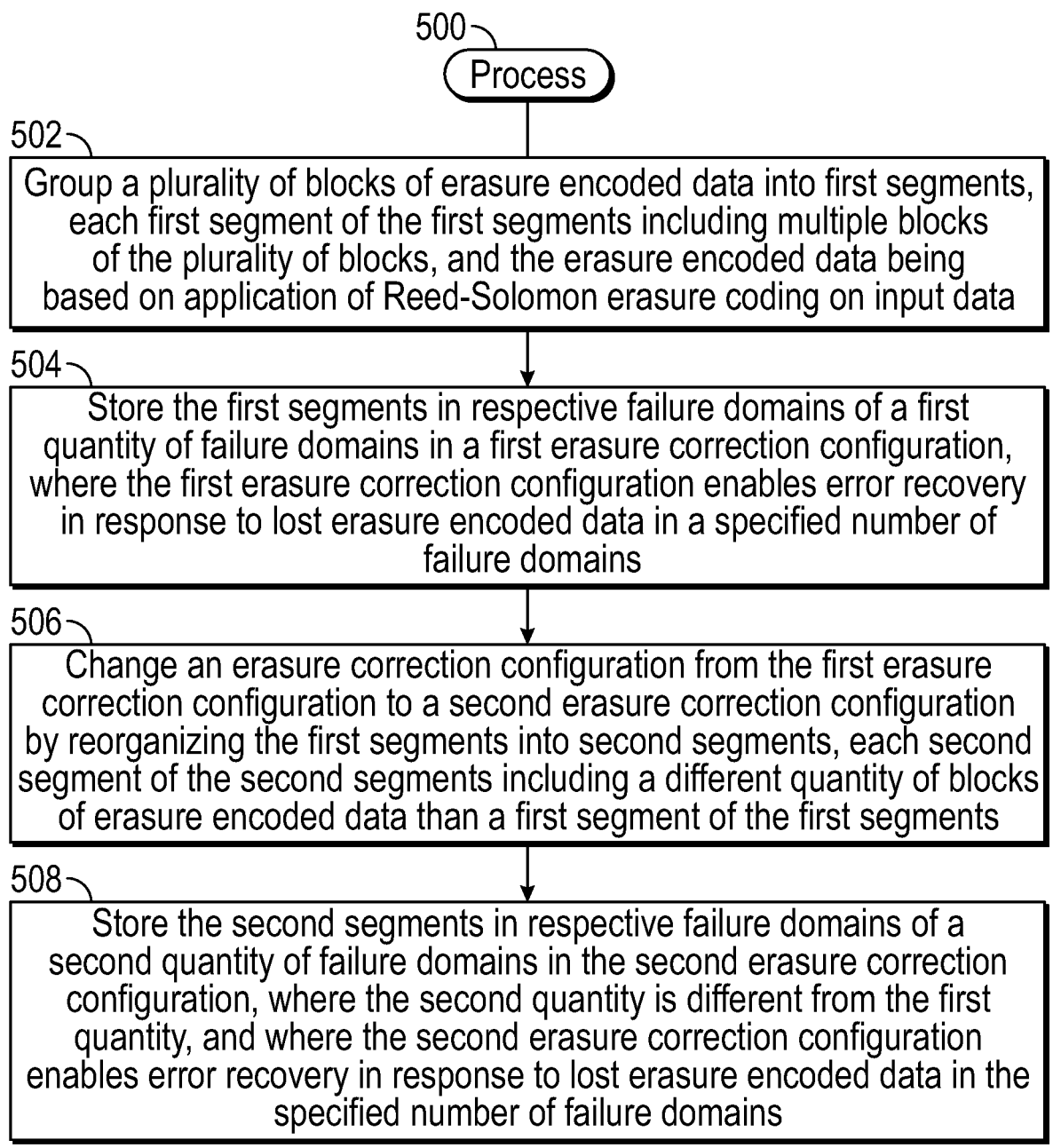
FIG. 5 is a flow diagram of a process according to some examples.

FIG. 5 is a flow diagram of a process 500 that can be performed by a system including a hardware processor.

The process 500 includes grouping (at 502) a plurality of blocks of erasure encoded data into first segments, each first segment of the first segments including multiple blocks of the plurality of blocks, and the erasure encoded data being based on application of Reed-Solomon erasure coding on input data.

The process 500 includes storing (at 504) the first segments in respective failure domains of a first quantity of failure domains in a first erasure correction configuration. The first erasure correction configuration enables error recovery in response to lost erasure encoded data in a specified number (m) of failure domains.

The process 500 includes changing (at 506) an erasure correction configuration from the first erasure correction configuration to a second erasure correction configuration by reorganizing the first segments into second segments, each second segment of the second segments including a different quantity of blocks of erasure encoded data than a first segment of the first segments.

In some examples, changing the erasure correction configuration is in response to a change in a quantity of failure domains due to addition or removal of storage hardware (e.g., server computer, storage device, etc.).

The process 500 includes storing (at 508) the second segments in respective failure domains of a second quantity of failure domains in the second erasure correction configuration, where the second quantity is different from the first quantity, and where the second erasure correction configuration enables error recovery in response to lost erasure encoded data in the specified number (m) of failure domains.

A storage medium (e.g., 300 in FIG. 3 or 404 in FIG. 4) can include any or some combination of the following: a semiconductor memory device such as a dynamic or static random access memory (a DRAM or SRAM), an erasable and programmable read-only memory (EPROM), an electrically erasable and programmable read-only memory (EEPROM) and flash memory; a magnetic disk such as a fixed, floppy and removable disk; another magnetic medium including tape; an optical medium such as a compact disk (CD) or a digital video disk (DVD); or another type of storage device. Note that the instructions discussed above can be provided on one computer-readable or machine-readable storage medium, or alternatively, can be provided on multiple computer-readable or machine-readable storage media distributed in a large system having possibly plural nodes. Such computer-readable or machine-readable storage medium or media is (are) considered to be part of an article (or article of manufacture). An article or article of manufacture can refer to any manufactured single component or multiple components. The storage medium or media can be located either in the machine running the machine-readable instructions, or located at a remote site from which machine-readable instructions can be downloaded over a network for execution.

In the foregoing description, numerous details are set forth to provide an understanding of the subject disclosed herein. However, implementations may be practiced without some of these details. Other implementations may include modifications and variations from the details discussed above. It is intended that the appended claims cover such modifications and variations.

What is claimed is:

1. A non-transitory machine-readable storage medium comprising instructions that upon execution cause a system to:
group a plurality of blocks of encoded data into first segments, each first segment of the first segments comprising multiple blocks of the plurality of blocks, and the encoded data being based on application of erasure correction coding on input data;
store the first segments in respective failure domains of a first quantity of failure domains in a first erasure correction configuration, wherein the first erasure correction configuration enables error recovery in response to lost encoded data in a specified number of failure domains;
change an erasure correction configuration from the first erasure correction configuration to a second erasure correction configuration by reorganizing the first segments into second segments, each second segment of the second segments comprising a different quantity of blocks of encoded data than a first segment of the first segments; and
store the second segments in respective failure domains of a second quantity of failure domains in the second erasure correction configuration, wherein the second quantity is different from the first quantity.

2. The non-transitory machine-readable storage medium of claim 1, wherein the first segments according to the first erasure correction configuration comprise n1+m first segments, where m represents the specified number, and n1 represents a number of segments of the input data recoverable in a presence of up to m segments of lost encoded data, and
wherein the second segments according to the second erasure correction configuration comprise n2+m second segments, where n2>n1, and n2 represents a number of segments of the input data recoverable in a presence of up to m segments of lost encoded data.

3. The non-transitory machine-readable storage medium of claim 2, wherein the reorganizing of the first segments into the second segments to change to the second erasure correction configuration is performed without recomputing encoded data based on the input data.

4. The non-transitory machine-readable storage medium of claim 3, wherein the reorganizing discards a number of the plurality of blocks of encoded data to produce a remainder of the plurality of blocks of encoded data, and wherein the instructions upon execution cause the system to:
group the remainder of the plurality of blocks of encoded data into the second segments.

5. The non-transitory machine-readable storage medium of claim 1, wherein the instructions upon execution cause the system to:
change the erasure correction configuration from the second erasure correction configuration to a third erasure correction configuration by reorganizing the second segments into third segments, each third segment of the third segments comprising a different quantity of blocks of encoded data than a second segment of the second segments.

6. The non-transitory machine-readable storage medium of claim 5, wherein the third erasure correction configuration comprises a third quantity of failure domains, the third quantity different from the second quantity.

7. The non-transitory machine-readable storage medium of claim 1, wherein the erasure correction coding comprises Reed-Solomon erasure coding.

8. The non-transitory machine-readable storage medium of claim 1, wherein the plurality of blocks of encoded data grouped into the first segments comprise 12 blocks of encoded data.

9. The non-transitory machine-readable storage medium of claim 1, wherein the instructions upon execution cause the system to:
change the erasure correction configuration from the second erasure correction configuration to a third erasure correction configuration associated with a third quantity of failure domains that is less than the second quantity of failure domains, wherein the changing of the erasure correction configuration from the second erasure correction configuration to the third erasure correction configuration comprises:
copying the blocks of encoded data in the second segments to third segments, and
recomputing blocks of encoded data to add to the third segments.

10. The non-transitory machine-readable storage medium of claim 9, wherein each third segment of the third segments has a larger quantity of blocks of encoded data than a second segment of the second segments.

11. The non-transitory machine-readable storage medium of claim 9, wherein the recomputing of the blocks of encoded data to add to the third segments comprises recomputing less than the plurality of blocks.

12. The non-transitory machine-readable storage medium of claim 1, wherein the first quantity of failure domains comprises a first quantity of server computers or a first quantity of storage devices, and the second quantity of failure domains comprises a second quantity of server computers or a second quantity of storage devices.

13. The non-transitory machine-readable storage medium of claim 1, wherein the plurality of blocks of encoded data include a first number of blocks of the input data, and a second number of blocks of parity data computed based on applying an encoding matrix to the input data.

14. A system comprising:
a processor; and
a non-transitory storage medium storing instructions executable on the processor to:
group a plurality of blocks of encoded data into first number of segments, each segment of the first number of segments comprising multiple blocks of the plurality of blocks, and the encoded data being based on application of error correction coding on input data;
store the segments of the first number of segments in respective failure domains of a first quantity of failure domains in a first error correction configuration, wherein the first number of segments support data recovery in response to up to a specified number of lost segments of the first number of segments,
change an error correction configuration from the first error correction configuration to a second error correction configuration by reorganizing the first number of segments into a second number of segments, each segment of the second number of segments comprising a different quantity of blocks of encoded data than a segment of the first number of segments; and
store the segments of the second number of segments in respective failure domains of a second quantity of failure domains in the second error correction configuration, wherein the second quantity is different from the first quantity, and a quantity of the segments in the second number of segments is different from a quantity of the segments in the first number of segments, and wherein the second number of segments support data recovery in response to up to the specified number of lost segments of the second number of segments.

15. The system of claim 14, wherein the quantity of the segments in the second number of segments is greater than the quantity of the segments in the first number of segments.

16. The system of claim 15, wherein the reorganizing of the first number of segments into the second segments to change to the second error correction configuration is performed without recomputing encoded data based on the input data.

17. The system of claim 14, wherein the quantity of the segments in the second number of segments is less than the quantity of the segments in the first number of segments.

18. The system of claim 17, wherein the reorganizing of the first number of segments into the second segments to change to the second error correction configuration comprises:
copying the blocks of encoded data in the first number of segments to second segments, and
recomputing blocks of encoded data to add to the second segments.

19. A method of a system comprising a hardware processor, comprising:
grouping a plurality of blocks of erasure encoded data into first segments, each first segment of the first segments comprising multiple blocks of the plurality of blocks, and the erasure encoded data being based on application of Reed-Solomon erasure coding on input data;
storing the first segments in respective failure domains of a first quantity of failure domains in a first erasure correction configuration, wherein the first erasure correction configuration enables error recovery in response to lost erasure encoded data in a specified number of failure domains;
changing an erasure correction configuration from the first erasure correction configuration to a second erasure correction configuration by reorganizing the first segments into second segments, each second segment of the second segments comprising a different quantity of blocks of erasure encoded data than a first segment of the first segments; and
storing the second segments in respective failure domains of a second quantity of failure domains in the second erasure correction configuration, wherein the second quantity is different from the first quantity, and wherein the second erasure correction configuration enables error recovery in response to lost erasure encoded data in the specified number of failure domains.

20. The method of claim 19, wherein changing the erasure correction configuration is in response to a change in a quantity of failure domains due to addition or removal of storage hardware.

* * * * *